(12) United States Patent
Park et al.

(10) Patent No.: US 6,656,788 B2
(45) Date of Patent: Dec. 2, 2003

(54) METHOD FOR MANUFACTURING A CAPACITOR FOR SEMICONDUCTOR DEVICES

(75) Inventors: Dong Su Park, Kyoungki-do (KR); Byoung Kwon Ahn, Seoul (KR)

(73) Assignee: Hyundai Electronic Industries Co., Ltd., Kyoungki-do (KR)

( * ) Notice: Subject to any disclaimer, the term of this patent is extended or adjusted under 35 U.S.C. 154(b) by 16 days.

(21) Appl. No.: 09/751,843

(22) Filed: Jan. 2, 2001

(65) Prior Publication Data

US 2001/0014510 A1 Aug. 16, 2001

(30) Foreign Application Priority Data

Dec. 30, 1999 (KR) .............................................. 99-67176

(51) Int. Cl.[7] .......................................... H01L 21/8242
(52) U.S. Cl. ........................ 438/253; 438/381; 438/396
(58) Field of Search .................................. 438/396, 240, 438/369, 287, 391, 388, 253, 238, 881

(56) References Cited

U.S. PATENT DOCUMENTS

| | | | | | |
|---|---|---|---|---|---|
| 5,230,925 | A | * | 7/1993 | Ohmine | 427/255.3 |
| 6,228,702 | B1 | * | 5/2001 | Hirota | 438/240 |
| 6,338,995 | B1 | * | 1/2002 | Hwang et al. | 438/240 |
| 6,355,519 | B1 | * | 3/2002 | Lee | 438/250 |
| 6,534,395 | B2 | * | 3/2003 | Werkhoven et al. | 438/627 |

* cited by examiner

*Primary Examiner*—Olik Chaudhuri
*Assistant Examiner*—Khiem D Nguyen
(74) *Attorney, Agent, or Firm*—Pillsbury Winthrop LLP

(57) ABSTRACT

A capacitor for a semiconductor device is manufactured by forming a lower structure on a semiconductor device, forming a lower electrode on the lower structure of the semiconductor device, forming a dielectric thin film by depositing an amorphous TaON film on the surface of the lower electrode, and supplying a Ta source gas in a mono-pulse manner and continuously supplying a reaction gas even when the Ta source gas is not supplied, and forming an upper electrode on the upper portion of the dielectric thin film.

30 Claims, 10 Drawing Sheets

Comparison of reaction source injection in depositing of TaON thin film

METHOD FOR MANUFACTURING A CAPACITOR FOR SEMICONDUCTOR DEVICES

BACKGROUND OF THE INVENTION

1. Field of the Invention

The present invention relates to a method for manufacturing a capacitor for semiconductor devices, and more particularly, to a method for manufacturing a capacitor for semiconductor devices having a TaON film as its dielectric layer.

2. Description of the Related Art

Recently as the level of integration in semiconductor devices has increased, much research and developments have been directed toward reducing the effective cell area and reducing the devise operation voltage. In these efforts, as the unit area available for the capacitor formation has reduced remarkably, the electric charge needed to operate memory devices—that is the capacitance per unit area— needs to be increased.

Accordingly, conventional methods to obtain sufficient capacitance values have included: increasing the area for capacitor formation by modifying the structure of the widely used cylinder structure; reducing the thickness of a dielectric film; and substituting the silicon oxide which forms the dielectric film with a NO (Nitride-Oxide) or ONO (Oxide-Nitride-Oxide) structure, or $Ta_2O_5$ or BST ($BaSrTiO_3$) which can provide higher capacitance values due to their high dielectric constant (20 to 25).

Recently, because of the limitations inherent in capacitors having a NO dielectric in providing sufficient capacitance that is needed for the next generation of memory devices, such as DRAM's with 256M or greater, the use of a $Ta_2O_5$ dielectric film has been receiving subject of the active research and development efforts. However, the $Ta_2O_5$ thin film has an unstable stoichiometry that generates displaceable Ta atoms with oxygen vacancies due to an unbalanced composition ratio between the Ta and O atoms present in the thin film. In addition, during the formation of a dielectric film, such impurities as carbon atoms (C) and carbon compounds ($CH_4$ or $C_2H_4$) and water $H_2O$ are generated from the reaction between the organic portion of $Ta(OC_2H_5)_5$—a precursor of $Ta_2O_5$—and $O_2$ gas. Consequently, due to the carbon atoms as well as other ions and free radicals existing in the $Ta_2O_5$ thin film as impurities, the resulting capacitors tend to exhibit increased leakage current and degraded dielectric characteristics.

To remove or significantly reduce such impurities in the $Ta_2O_5$ thin film, a low temperature heating treatment—for example plasma $N_2O$ or $UV-O_3$—is performed twice or three times. However, this heat treatment makes a manufacturing process complicated, and since the $Ta_2O_5$ thin film is susceptible to oxidation, the lower electrode may be oxidized during the heat treatment.

To improve the unstable stoichiometry of the $Ta_2O_5$, the dielectric film of a capacitor is replaced by TaON. Since TaON has a dielectric constant over 25, it has high permitivity and the chemical composition structure is more stable than the $Ta_2O_5$ thin film, thus generating less oxidation reaction with the lower electrode.

Further, a capacitor using TaON can reduce the thickness of an equivalent oxide film (Tox) than capacitors having the NO or $Ta_2O_5$ dielectric. Additionally, the TaON capacitor is strong to an electric impact applied from the outside and has a high breakdown voltage while having a low leakage current.

However, because $Ta(OC_2H_5)$ is sued as a Ta source gas and $O_2$ or $NH_3$ which is used as a reaction gas during deposition of TaON, carbon and hydrogen impurities are still present in the $Ta_2O_5$ thin film so the resultant capacitors tend to exhibit degraded dielectric characteristics.

SUMMARY OF THE INVENTION

To solve the above problems, it is an objective of the present invention to provide a method for manufacturing a capacitor for a semiconductor device by which a capacitor suitable for a highly integrated semiconductor device can be obtained by using a dielectric film having a high dielectric constant and superior electric characteristics.

Also, it is another objective of the present invention to provide a method for manufacturing a capacitor for a semiconductor device which can reduce leakage current and improve electric properties of the semiconductor device.

Accordingly, to achieve the above objectives, there is provided a method for manufacturing a capacitor for a semiconductor device comprising the steps of forming a lower structure on a semiconductor device, forming a lower electrode on the lower structure of the semiconductor device, forming a dielectric thin film by depositing an amorphous TaON film on the surface of the lower electrode, and supplying the source gas of a Ta component in a mono-pulse manner and continuously supplying a reaction gas even when the Ta source gas is not supplied, and forming an upper electrode on the upper portion of the dielectric thin film.

According to another embodiment of the present invention, there is provided a method for manufacturing a capacitor for a semiconductor device comprising the steps of forming a lower structure on a semiconductor device, forming a lower electrode on the lower structure of the semiconductor device, nitrifying the surface of the lower electrode by plasma or through a metal thermal process, forming an amorphous TaON film on the surface of the lower electrode, and supplying a Ta source gas in a mono-pulse manner and continuously supplying a reaction gas even when the Ta component gas is not supplied, crystallizing the amorphous TaON film by a metal thermal process or an annealing process, forming an upper electrode on the upper portion of the dielectric film.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
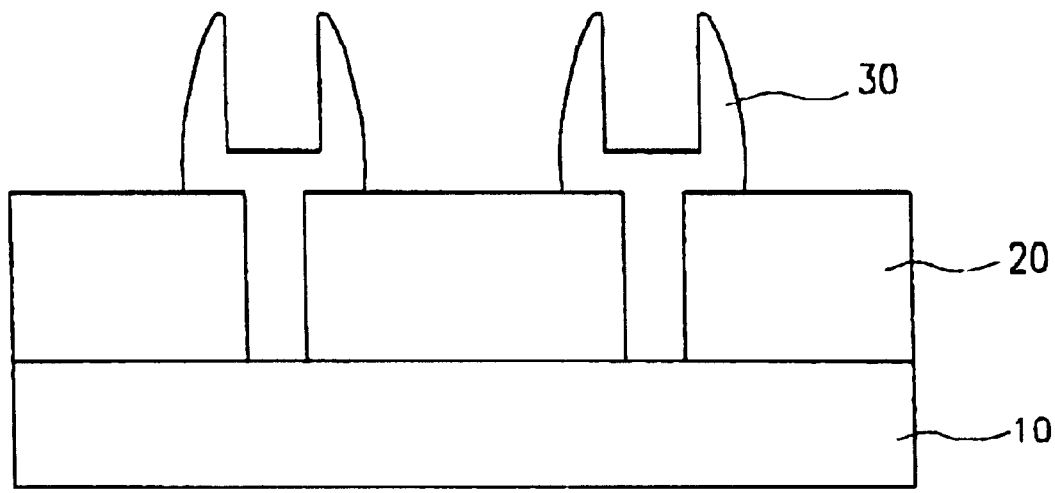
FIGS. 1 through 4 are views for sequentially explaining a method for manufacturing a capacitor for a semiconductor device according to a preferred embodiment of the present invention.

A method for manufacturing a capacitor for a semiconductor device according to a preferred embodiment of the present invention will be described with reference to FIGS. 1 through 4. Referring to FIG. 1, although not shown in the drawing, a semiconductor device having a gate electrode and a source/drain electrode are formed on the upper surface of an active zone of a semiconductor substrate 10. Next, a material selected from USG (undoped silicate glass), BPSG (boro phospho silicate glass) and SiON is deposited on the entire surface of the semiconductor substrate 10. The deposited material undergoes a chemical mechanical polishing process so that a planar intermediate insulating film 20 is formed.

Then, to secure the active zone of the semiconductor substrate 10, that is, a sectional area of a capacitor contacting a drain area, the intermediate insulating film 20 is selectively etched by a photolithography and an etching method so that a contact hole (not shown) is formed.

Next, doped polysilicon or amorphous doped polysilicon is deposited in the contact hole to form a lower electrode 30. Here, the structure of the lower electrode 30 of the capacitor may be one of a stack, a cylinder, a pin and a stack cylinder structure. In particular, in the preferred embodiment according to the present invention, the lower electrode is formed to have a cylinder structure.

Although not shown in the drawings, to secure a predetermined capacitance by enlarging an effective unit cell area of the lower electrode 30, the upper surface of the lower electrode 30 can be formed in the form of HSG (hemispherical grain).

Figure 2:
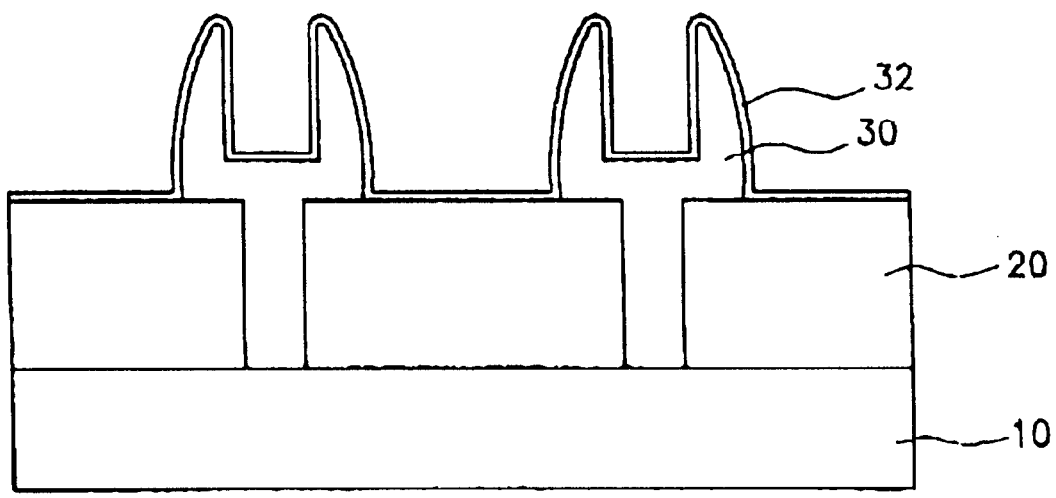
Figure 1A:
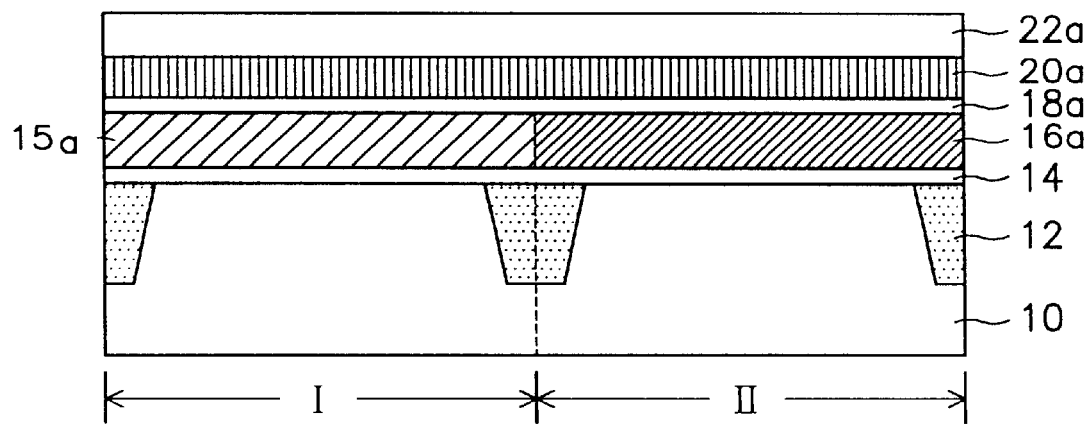
Figure 1B:
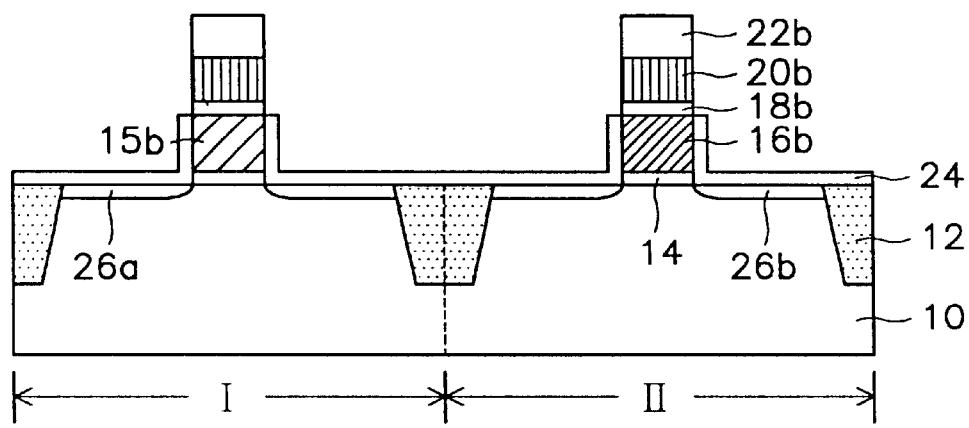
Figure 1C:
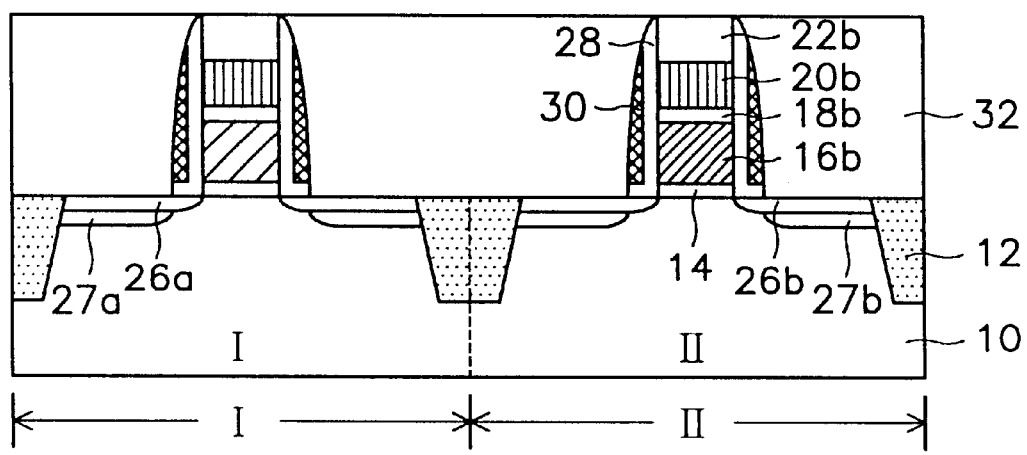
Figure 2A:
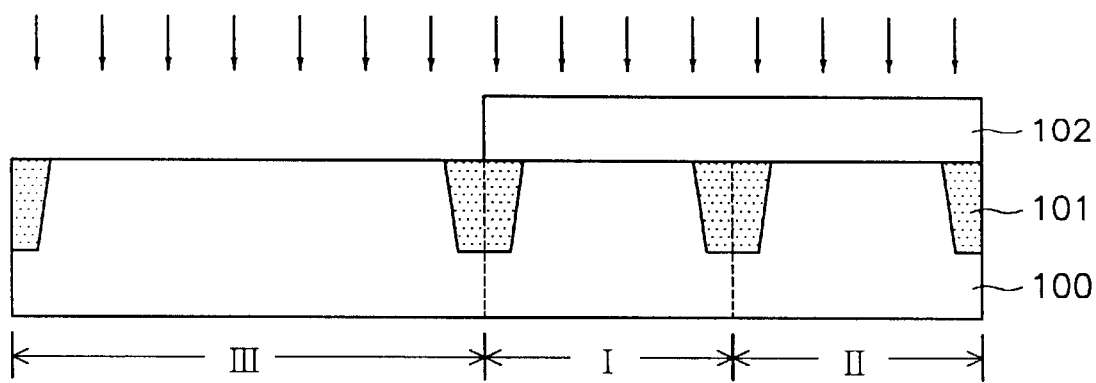
Figure 2B:
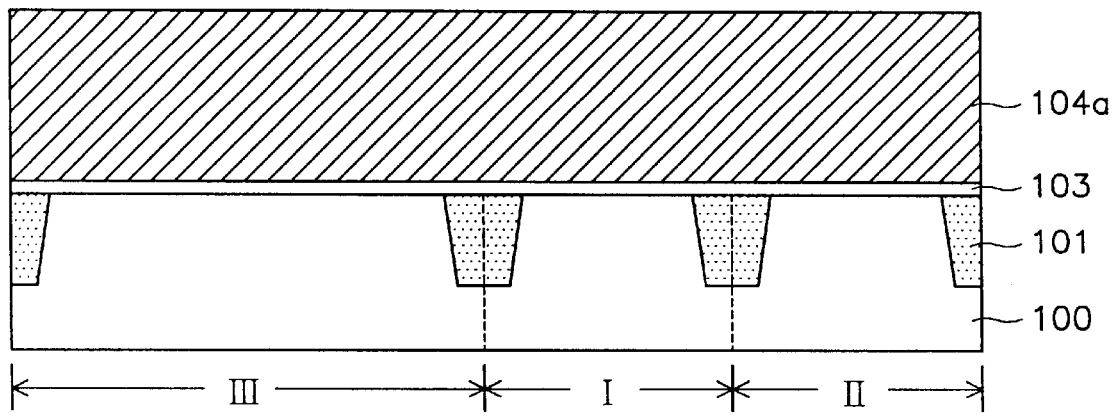
Figure 2C:
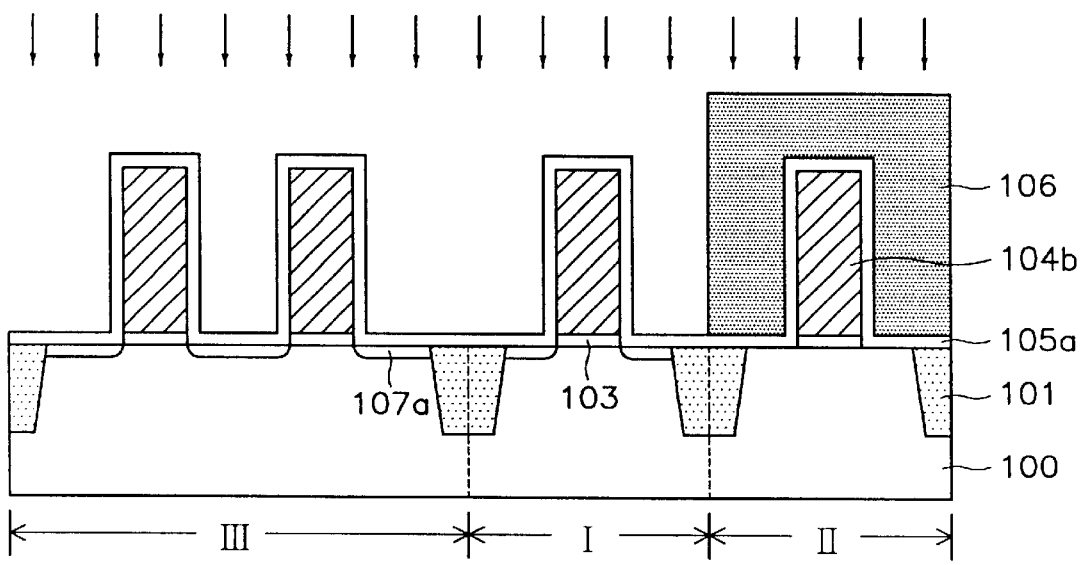
Figure 2D:
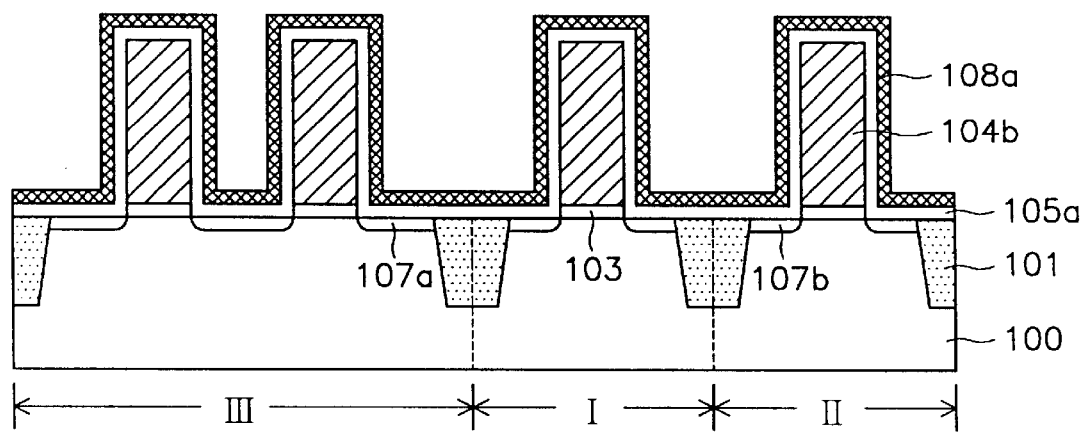
Figure 2E:
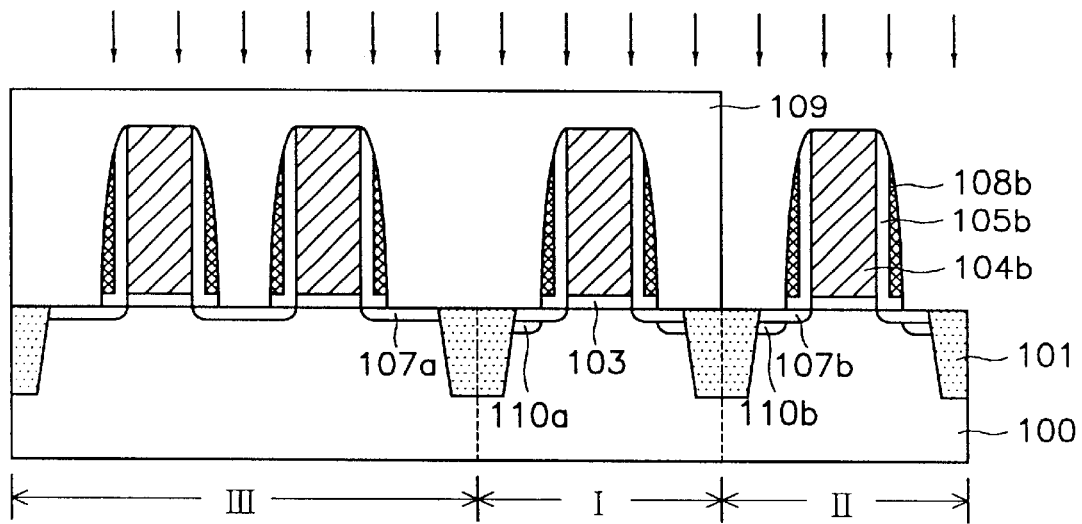
Figure 2F:
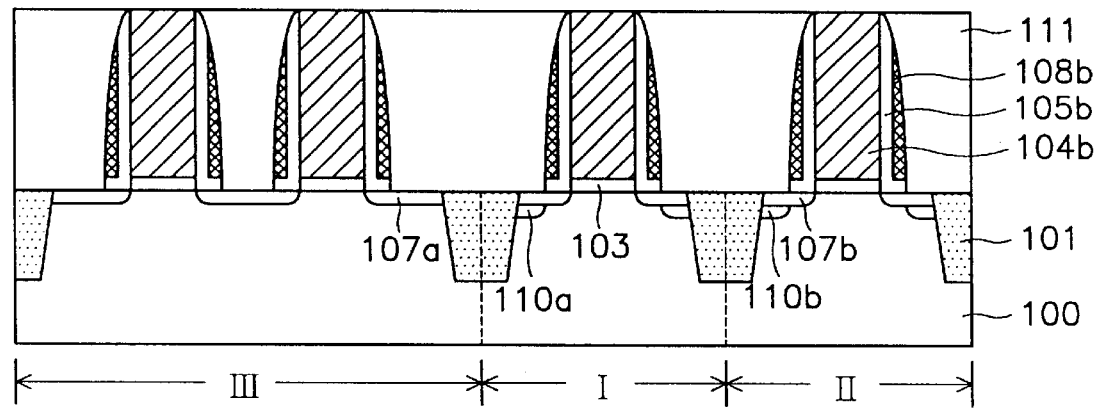
Figure 2G:
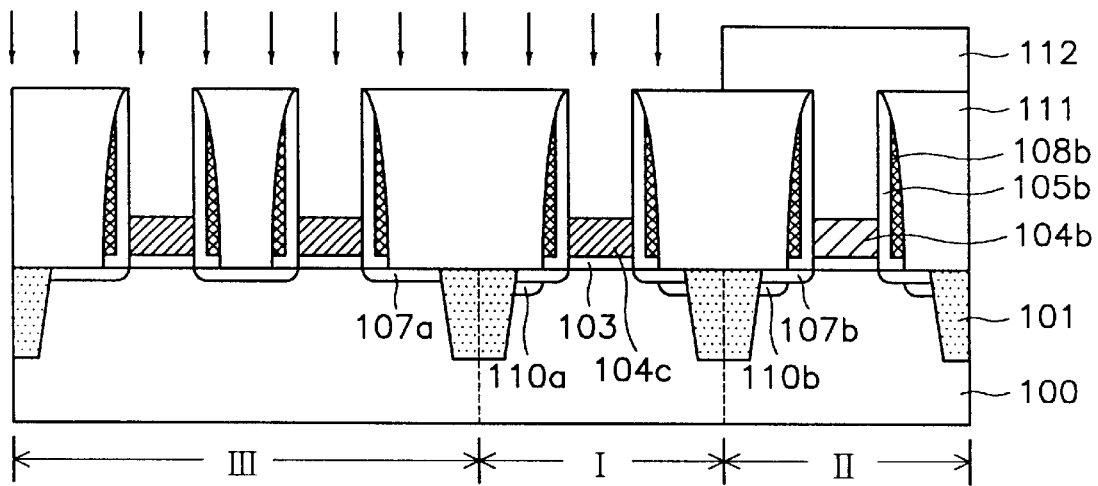
Figure 2H:
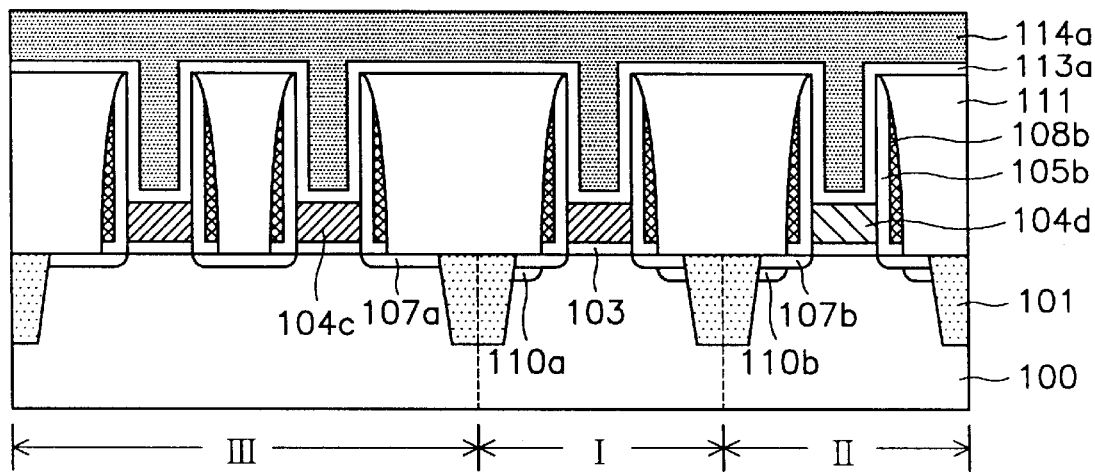
Figure 2I:
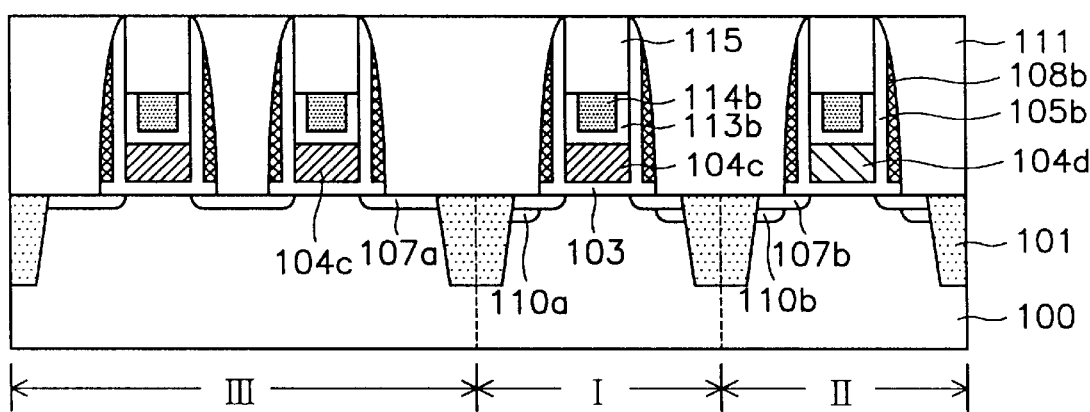

Then, as shown in FIG. 2, to prevent formation of a natural oxide film on the surface of polycrystal silicon forming the lower electrode 30 prior to the formation of a TaON thin film which will be deposited in the subsequent process, the surface of the polycrystal silicon forming the lower electrode 30 undergoes a nitridation process to form a nitride thin film 32 in an atmosphere of $NH_3$ (alternatively $N_2/H_2$ or $N_2O$) in a reaction chamber for a lower pressure chemical vapor deposition at the temperature of about 200° C. to 600° C. in an in-situ process for about 30 seconds to 10 minutes using a plasma.

Here, instead of using plasma, the $Si_3N_4$ thin film 32 can be formed by performing a rapid thermal process or performing the nitridation process in an $NH_3$ atmosphere in a temperature of about 650 to 950° C. for about one minute to 30 minutes by using a furnace.

Figure 3:
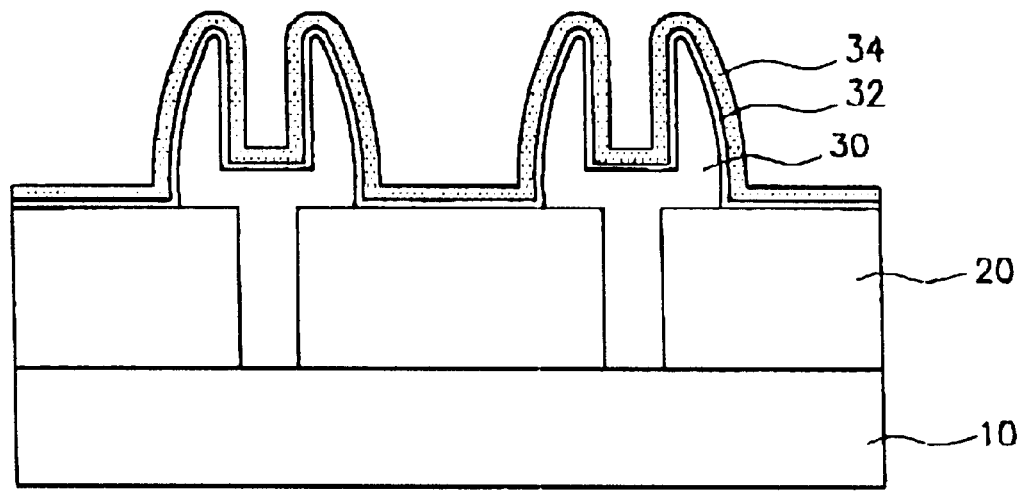

Next, according to the present invention, an amorphous TaON film is deposited on the upper surface of the nitride thin film 32 to form a TaON dielectric thin film 34, as shown in FIG. 3. Here, during the deposition process of the amorphous TaON film, the Ta source gas is provided in a mono-pulse manner, and a reaction gas is provided continuously even when the source gas is not being provided.

The deposition process of the amorphous TaON is performed in the lower pressure chemical vapor deposition chamber at a temperature of about 300° C. to 600° C. by inducing a surface chemical reaction on a wafer where gas phase reaction is restricted.

The deposition process of the amorphous TaON thin film will be described in detail as follows. First, $Ta(OC_2H_5)_5$ or $H_2TaF_7$ is used as the Ta source gas and an oxygen containing compound-selected among $O_2$, $N_2O$ and $O_3$—and $NH_3$ are used as a reaction gas.

Here, the chemical vapor of the Ta component in the source gas is obtained by vaporizing a particular amount of a Ta compound such as 99.999% or more of $Ta(OC_2H_5)_5$ or $H_2TaF_7$ by a mass flow controller through a vaporizer or a vaporizing pipe maintained at a constant temperature within a range of temperature between about 150° C. and 200° C.

The chemical vapor of the Ta component provided in the low pressure chemical deposition chamber in the above method is supplied to each of the reaction gases, $O_2$ (alternatively $N_2O$ or $O_3$) and $NH_3$ (a range of about 10 sccm to 1000 sccm). Then, a surface chemical reaction is induced in the low pressure chemical deposition chamber at a temperature of about 300° C. to 600° C. so that an amorphous TaON thin film can be obtained.

Further, in the deposition of the amorphous TaON deposition, the TaON dielectric thin film 34 is crystallized by performing a rapid thermal process at a temperature between about 650° C. and 950° C. for about 0.5–30 minutes, or annealing the deposited amorphous TaON in an atmosphere of $N_2O$, $O_2$ or $N_2$ at a temperature of about 650° C. to 950° C. for about 1 to 30 minutes using an electric furnace.

In a manufacturing process of the TaON dielectric thin film 34 through the above annealing process, impurities of carbon atoms or carbon compounds generated during the amorphous TaON deposition process and oxygen pores existing in the film are removed, and crystallization is induced so that the high density of the dielectric film is achieved.

Also, after the amorphous TaON is deposited, the surface of the amorphous TaON is nitrified (nitric-acidified) in an atmosphere of $NH_3$ or $N_2/H_2$ ($N_2O$ or $O_2$) and at a temperature between about 200° C. and 600° C. by using plasma in an in-situ or ex-situ process.

Through such annealing processes, volatile carbon compound (CO, $CO_2$, $CH_4$ and $C_2H_4$) and water ($H_2O$) remaining in the amorphous TaON film are removed, and crystallization is induced so that generation of the leakage current is prevented. Also, the nitrification process to remove the carbon compounds compensates for a structural defect such as micro cracks and pin holes on a boundary surface and improves homogeneity.

Figure 4:
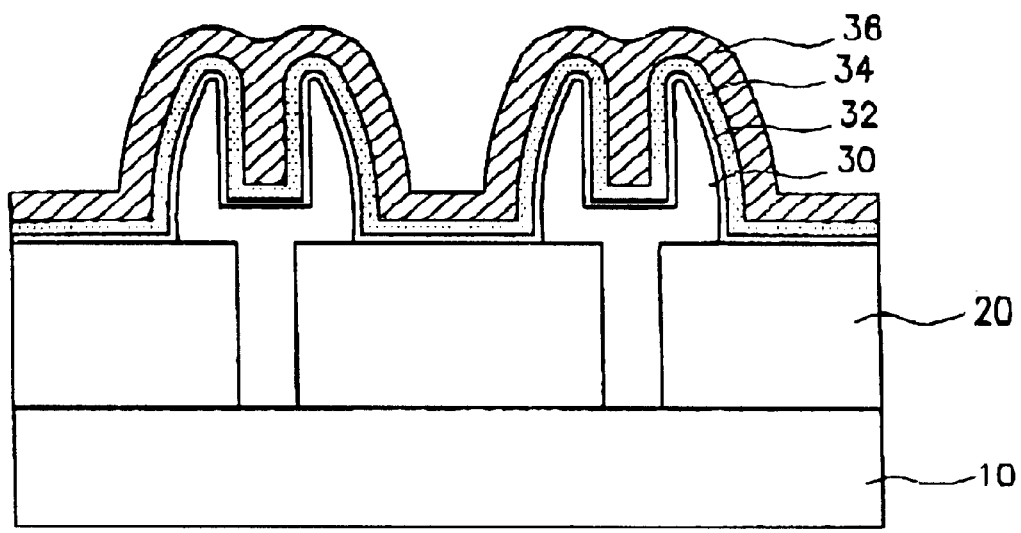

Next, as shown in FIG. 4, doped polysilicon is deposited on the upper portion of the TaON dielectric thin film 34 as a conductive body and the deposited doped polysilicon is patterned to form an upper electrode 36. Thus, a manufacturing process of a SIS (silicon-insulator-silicon) type cylinder capacitor having a TaON dielectric according to a preferred embodiment of the present invention is completed.

Here, a metal layer functioning as a conduction barrier and a doped polysilicon layer functioning as a buffer are deposited as a conductive body of the upper electrode 36 so that a capacitor having an overall MIS (metal-insulator silicon) structure can be formed. Also, for the metal layer as a conduction barrier material, one selected from a group consisting of TiN, TaN, W, WN, WSi, Ru, $RuO_2$, Ir, $IrO_2$ and Pt can be used. Additionally, according to the present invention, a process for manufacturing a capacitor having an overall MIM (metal-insulator-metal) can be performed by depositing doped silicon and the metal layer as a conductive body of the lower electrode 30.

Figure 5:
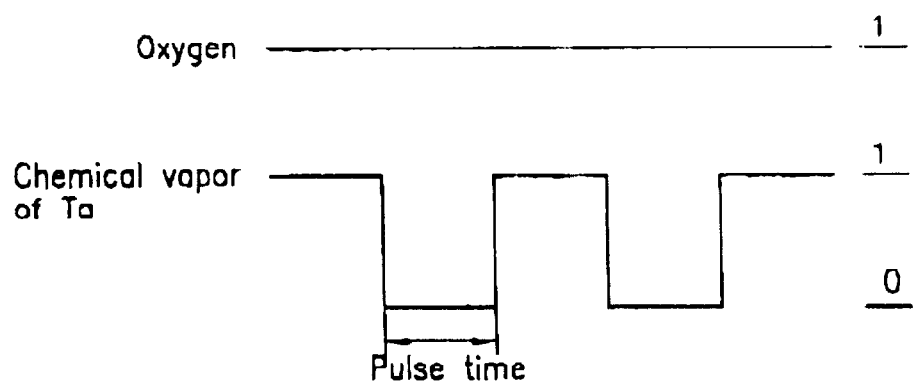
FIG. 5 is a view showing the difference in injection of a Ta source gas and oxygen that is a reaction gas during the process of manufacturing a capacitor for a semiconductor device according to the present invention.

FIG. 5 shows the difference in injection of a Ta source gas and oxygen that is a reaction gas. As shown in FIG. 5, during the deposition process of a TaON dielectric thin film according to the present invention, the Ta source gas ($Ta(OC_2H_5)_5$ or $H_2TaF_7$) is supplied in a pulse manner (0, 1). The reaction gas (oxygen based gas which is one of $O_2$, $N_2O$ and $O_3$, and $NH_3$) is continuously supplied during the time even when the Ta source gas is not being supplied.

FIG. 5 shows the difference in injection of a Ta source gas and oxygen that is a reaction gas. As shown in FIG. 5, during the deposition process of a TaON dielectric thin film according to the present invention, the Ta source gas ($Ta(OC_2H_5)_5$ or $H_2TaF_7$) is supplied in a pulse manner (0,1). The reaction gas (oxygen containing compound which is one of $O_2$, $N_2O$ and $O_3$, and $NH_3$) is continuously supplied during the time even when the Ta source gas is not being supplied.

As described above, the method for manufacturing a capacitor for a semiconductor device according to the present invention has the following advantages.

In the present invention, during the deposition process of a TaON thin film, a Ta source gas is supplied to a reaction chamber in a pulse manner while the reaction gas is continuously injected therein. Thus, when the Ta source is not supplied, the time during which the volatile carbon compounds existing in the TaON film can react with the oxygen gas supplied into the chamber during the TaON deposition process is prolonged so that the amount of carbon and hydrogen impurities in the TaON film are reduced drastically. Thus, the leakage current characteristics of the dielectric film are improved, and the film becomes dense.

As described above, in the present invention, since TaON dielectric film having a higher permitivity than other dielectrics and a stable combination structure is used, the oxygen reaction with the lower electrode is minimized and the thickness of an equivalent oxide film can be reduced less than 30 Å so that high capacitance values can be obtained.

In particular, since the TaON dielectric thin film according to the present invention has a more stable T—O—N combination structure than a $Ta_2O_5$ thin film having unstable stoichiometry, the TaON dielectric thin film can resist electric impact applied from the outside and exhibits a higher surrender voltage which is an insulation destruction voltage and low leakage current, compared to an NO or $Ta_2O_5$ dielectric film.

What is claimed is:

1. A method for manufacturing a capacitor in a semiconductor device comprising:

forming a lower structure on a semiconductor device;

forming a lower electrode on the lower structure of the semiconductor device;

forming a dielectric thin film by depositing an amorphous TaON film on a surface of the lower electrode, and supplying a Ta source gas in a mono-pulse manner and continuously supplying a reaction gas even when the Ta source gas is not being supplied; and forming an upper electrode on the upper portion of the dielectric thin film;

wherein, before the amorphous TaON film is deposited, the surface of the lower electrode is nitrified by using plasma at a temperature between about 300 C. and 600 C. in an $NH_3$ atmosphere for about 0.5 to 10 minutes.

2. The method as claimed in claim 1, wherein the Ta source gas is one of Ta $(OC_2H_5)_5$ and $H_2TaF_7$.

3. The method as claimed in claim 1, wherein the reaction gas is an oxygen containing compound selected from a group consisting of $O_2$, $N_2O$ and $O_2$, and $NH_3$.

4. The method as claimed in claim 1, wherein, before the amorphous TaON film is deposited, the surface of the lower electrode is nitrified by using plasma at a temperature between about 300° C. and 600° C. in an $NH_3$ atmosphere for about 0.5 to 10 minutes.

5. The method as claimed in claim 1, wherein the deposition of the amorphous TaON film is performed by vaporizing a predetermined amount of a Ta compound, provided by a flow controller to obtain chemical vapor of the Ta component, by a vaporizer maintained at a constant temperature in a range between about 150° C. and 200° C.

6. The method as claimed in claim 1, wherein the deposition process of the amorphous TaON is performed by supplying each of the Ta source gas and the reaction gas by a flow controller into a low pressure chemical deposition chamber at a temperature between about 300° C. and 600° C., inducing a surface chemical reaction in an atmosphere under 100 torr to deposit the amorphous TaON film.

7. The method as claimed in claim 1, wherein when depositing the amorphous TaON, a thermal process is performed at a temperature between about 650 C. and 950 C. for about 0.5 to 30 minutes to crystallize the amorphous TaON film.

8. The method as claimed in claim 1, wherein when depositing the amorphous TaON, the amorphous TaON film is crystallized by being annealed in an atmosphere of one of $N_2O$, $O_2$ and $N_2$ at a temperature between about 650° C. and 950° C. for about 1 to 30 minutes by using an electric furnace.

9. The method as claimed in claim 1, wherein, after the amorphous TaON is deposited, a surface of the amorphous TaON film is nitrified in an atmosphere of one of $NH_3$ and $N_2/H_2$ at a temperature between about 200° C. and 600°C. by using plasma.

10. The method as claimed in claim 1, wherein, after the amorphous TaON is deposited, a surface of the amorphous TaON film is nitrified in an atmosphere of one of $N_2O$ and $O_2$ at a temperature between about 200 C. and 600 C. by using plasma.

11. The method as claimed in claim 1, wherein each of the lower electrode and the upper electrode is formed of at least one of doped polysilicon and a metal or metal alloy.

12. The method as claimed in claim 11, wherein the metal or metal alloy is one selected from a group consisting of TiN, TaN, W, WN, WSi, Ru, $RuO_2$, Ir, $IrO_2$ and Pt.

13. The method as claimed in claim 1, wherein the lower electrode is formed in a polysilicon growing method of a hemispheric uneven structure.

14. The method as claimed in claim 11, wherein each of the lower electrode and the upper electrode is formed at least one of doped polysilicon and a metal substance, the metal substance being one selected from a group consisting of TiN, TaN, W, WN, WSi, Ru, $RuO_2$, Ir, $IrO_2$ and Pt.

15. A method for manufacturing a capacitor for a semiconductor device comprising:

forming a lower structure on a semiconductor device;

forming a lower electrode on the lower structure of the semiconductor device;

nitrifying a surface of the lower electrode by plasma or through a metal thermal process;

forming an amorphous TaON film on the surface of the lower electrode, and supplying a Ta source gas in a mono-pulse manner and continuously supplying a reaction gas even when the Ta source gas is not being supplied;

crystallizing the amorphous TaON film by a thermal process or an annealing process; and forming an upper electrode on the upper portion of the dielectric film;

wherein, after the amorphous TaON is deposited, a surface of the amorphous TaON film is nitrified in an atmosphere of one of $NH_3$ and $N_2/H_2$ at a temperature between about 200° C. and 600° C. by using plasma.

16. The method as claimed in claim 15, wherein, before the amorphous TaON film is deposited, the surface of the lower electrode is nitrified by one of using plasma at a temperature between about 300° C. and 600° C. in an NH3 atmosphere in an in-situ process for about 0.5 to 10 minutes, and performing a metal thermal process in a temperature range between about 650° C. and 950° C. in an $NH_3$ atmosphere.

17. The method as claimed in claim 15, wherein when depositing the amorphous TaON film, the amorphous TaON film is crystallized by performing one of a metal thermal process is performed at a temperature between about 650° C. and 950° C. for about 0.5 to 30 minutes, and an annealing process in an atmosphere of one of $N_2O$, $O_2$ and $N_2$ at a temperature between about 650° C. and 950° C. for about 1 to 30 minutes by using an electric furnace.

18. The method as claimed in claim 15, wherein, after the amorphous TaON is deposited, a surface of the amorphous TaON film is nitrified in an atmosphere of one of $NH_3$ and $N_2/H_2$ at a temperature between about 200° C. and 600° C. by using plasma.

19. A method for manufacturing a capacitor in a semiconductor device comprising:

forming a lower structure on a semiconductor device;

forming a lower electrode on the lower structure of the semiconductor device;

forming a dielectric thin film by depositing an amorphous TaON film on a surface of the lower electrode, and supplying a Ta source gas in a mono-pulse manner and continuously supplying a reaction gas even when the Ta source gas is not being supplied; and forming an upper electrode on the upper portion of the dielectric thin film;

wherein, after the amorphous TaON is deposited, a surface of the amorphous TaON film is nitrified in an atmosphere of one of $NH_3$ and $N_2/H_2$ at a temperature between about 200 C. and 600 C. by using plasma.

20. The method as claimed in claim 19, wherein the Ta source gas is one of $Ta(OC_2H_5)_5$ and $H_2TaF_7$.

21. The method as claimed in claim 19, wherein the reaction gas is an oxygen containing compound selected from a group consisting of $O_2$, $N_2O$ and $O_2$, and $NH_3$.

22. The method as claimed in claim 21, wherein, before the amorphous TaON film is deposited, the surface of the lower electrode is nitrified by using plasma at a temperature between about 300 C. and 600 C. in an $NH_3$ atmosphere for about 0.5 to 10 minutes.

23. The method as claimed in claim 19, wherein, before the amorphous TaON film is deposited, the surface of the lower electrode is nitrified by performing a thermal process in an $NH_3$ atmosphere and within a range of temperature between about 650 C. and 950 C.

24. The method as claimed in claim 19, wherein the deposition of the amorphous TaON film is performed by vaporizing a predetermined amount of a Ta compound, provided by a flow controller to obtain chemical vapor of the Ta component, by a vaporizer maintained at a constant temperature in a range between about 150 C. and 200 C.

25. The method as claimed in claim 19, wherein the deposition process of the amorphous TaON is performed by supplying each of the Ta source gas and the reaction gas by a flow controller into a low pressure chemical deposition chamber at a temperature between about 300 C. and 600 C., inducing a surface chemical reaction in an atmosphere under 100 torr to deposit the amorphous TaON film.

26. The method as claimed in claim 19, wherein when depositing the amorphous TaON, a thermal process is performed at a temperature between about 650 C. and 950 C. for about 0.5 to 30 minutes to crystallize the amorphous TaON film.

27. The method as claimed in claim 19, wherein when depositing the amorphous TaON, the amorphous TaON film is crystallized by being annealed in an atmosphere of one of $N_2O$, $O_2$ and $N_2$ at a temperature between about 650 C. and 950 C. for about 1 to 30 minutes by using an electric furnace.

28. The method as claimed in claim 19, wherein each of the lower electrode and the upper electrode is formed of at least one of doped polysilicon and a metal or metal alloy.

29. The method as claimed in claim 28, wherein the metal or metal alloy is one selected from a group consisting of TiN, TaN, W, WN, WSi, Ru, $RuO_2$, Ir, $IrO_2$ and Pt.

30. The method as claimed in claim 19, wherein the lower electrode is formed in a polysilicon growing method of a hemispheric uneven structure.

* * * * *